US012267956B2

(12) United States Patent
Serita et al.

(10) Patent No.: US 12,267,956 B2
(45) Date of Patent: Apr. 1, 2025

(54) MOUNTING STRUCTURE OF ELECTRONIC COMPONENT

(71) Applicant: Murata Manufacturing Co., Ltd., Nagaokakyo (JP)

(72) Inventors: Noboru Serita, Nagaokakyo (JP); Yoshiyuki Abe, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 320 days.

(21) Appl. No.: 17/955,795

(22) Filed: Sep. 29, 2022

(65) Prior Publication Data

US 2023/0104369 A1 Apr. 6, 2023

(30) Foreign Application Priority Data

Oct. 1, 2021 (JP) .................... 2021-162785

(51) Int. Cl.
| | |
|---|---|
| H05K 1/00 | (2006.01) |
| H01G 4/008 | (2006.01) |
| H01G 4/30 | (2006.01) |
| H05K 1/11 | (2006.01) |
| H05K 1/18 | (2006.01) |

(52) U.S. Cl.
CPC .......... *H05K 1/111* (2013.01); *H01G 4/0085* (2013.01); *H01G 4/30* (2013.01); *H05K 1/181* (2013.01); *H05K 2201/09418* (2013.01); *H05K 2201/10015* (2013.01); *H05K 2201/2081* (2013.01)

(58) Field of Classification Search
CPC ................ H05K 1/111; H05K 1/181; H05K 2201/09418; H05K 2201/10015; H05K 2201/2081; H01G 4/0085; H01G 4/30
See application file for complete search history.

(56) References Cited

U.S. PATENT DOCUMENTS

| | | | | |
|---|---|---|---|---|
| 2016/0141093 | A1* | 5/2016 | Jeong ..................... | H01F 17/04 336/200 |
| 2017/0223833 | A1* | 8/2017 | Lee .......................... | H01G 2/06 |
| 2017/0352484 | A1* | 12/2017 | Sawada .................... | H01G 4/12 |

FOREIGN PATENT DOCUMENTS

JP 2014-086606 A 5/2014

* cited by examiner

*Primary Examiner* — Pete T Lee
(74) *Attorney, Agent, or Firm* — Keating & Bennett, LLP (57) ABSTRACT

A mounting structure of an electronic component includes a multilayer ceramic capacitor including lands on a board and spaced apart from each other, solder on the lands, and a component main body including external electrodes on both end portions of the component main body in a length direction, each of the pair of external electrodes being connected to a corresponding one of the pair of lands via the solder. When a separation direction of the lands is an X direction and a direction orthogonal or substantially orthogonal to the X direction is a Y direction, when a width dimension of the land along the Y direction is c, a dimension of each of the external electrodes in the X direction is e, and a gap between the land and the external electrode is Gap, 3.4<(c×e)/Gap<258.8 is satisfied.

15 Claims, 8 Drawing Sheets

MOUNTING STRUCTURE OF ELECTRONIC COMPONENT

CROSS REFERENCE TO RELATED APPLICATIONS

This application claims the benefit of priority to Japanese Patent Application No. 2021-162785 filed on Oct. 1, 2021. The entire contents of this application are hereby incorporated herein by reference.

BACKGROUND OF THE INVENTION

1. Field of the Invention

The present invention relates to a mounting structure of an electronic component.

2. Description of the Related Art

Conventionally, two-terminal electronic components such as a multilayer ceramic capacitor and an inductor have been mounted on a circuit board by soldering. Japanese Unexamined Patent Application Publication No. 2014-086606 discloses a mounting structure in which a pair of external electrodes provided at both ends in the length direction of a multilayer ceramic capacitor are connected to a pair of electrode pads provided on a board by soldering.

In such a mounting structure of the multilayer ceramic capacitor, a crack may occur in the main body of the electronic component starting from the boundary between the external electrode and the multilayer body on the outer surface due to deflection of the board and, therefore, it is necessary to take measures.

SUMMARY OF THE INVENTION

Preferred embodiments of the present invention provide mounting structures of electronic components that are each able to reduce or prevent generation of cracks in an electronic component when deflection occurs in a board.

A preferred embodiment of the present invention provides a mounting structure of an electronic component that includes the electronic component including a pair of lands on a board and spaced apart from each other, solder on each of the lands, and a component main body including a pair of external electrodes on both end portions of the component main body in a length direction, each of the pair of external electrodes being connected to a corresponding one of the pair of lands via the solder, in which, in a case where a separation direction of the pair of lands is defined as an X direction and a direction orthogonal or substantially orthogonal to the X direction is defined as a Y direction, when a width dimension of the land along the Y direction is defined as c, a dimension of each of the external electrodes in the X direction is defined as e, and a gap between the land and the external electrode is defined as Gap, $3.4<(c\times e)/Gap<258.8$ is satisfied.

According to preferred embodiments of the present invention, it is possible to provide mounting structures of electronic components that are each able to reduce or prevent generation of cracks in an electronic component when deflection occurs in a board.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments will be described with reference to the drawings.

First Preferred Embodiment

Figure 1:
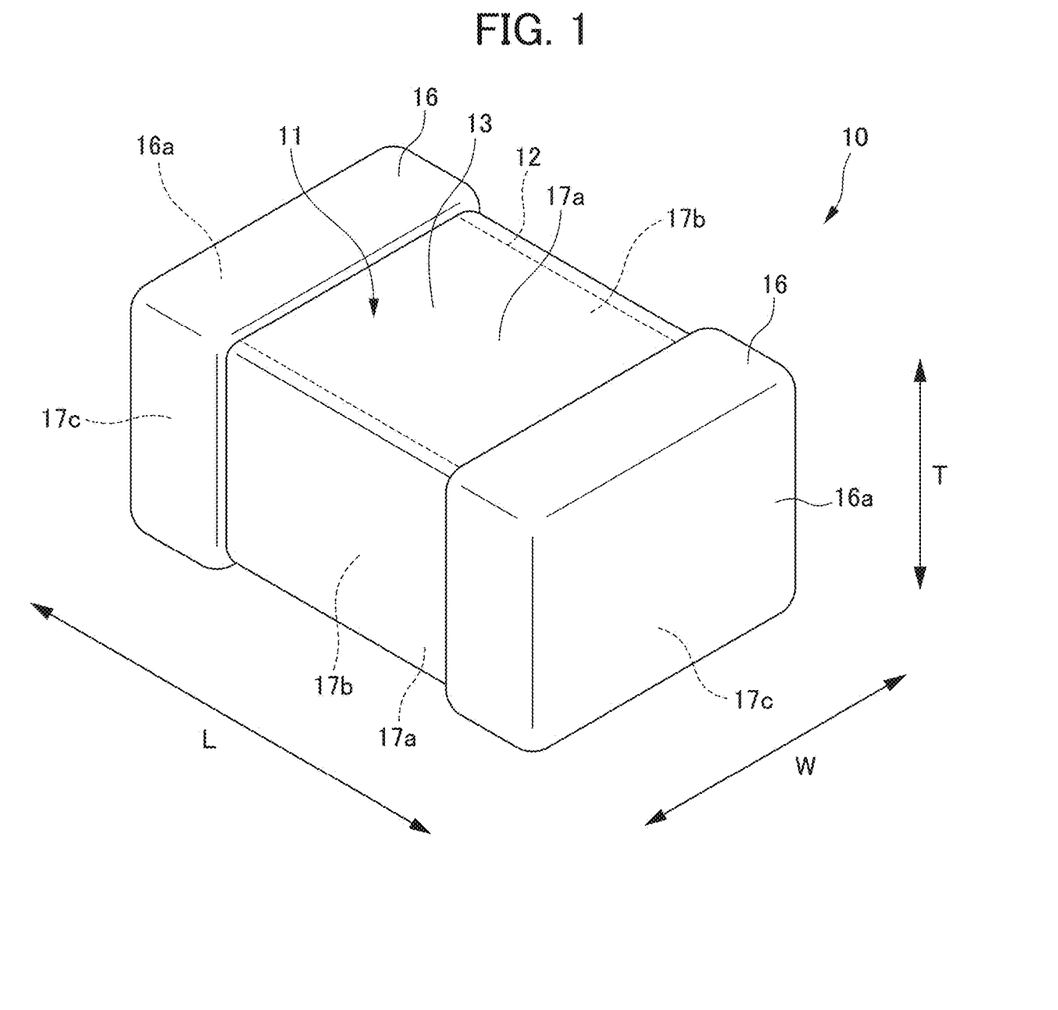
FIG. 1 is a perspective view of a multilayer ceramic capacitor as an electronic component applied to a mounting structure according to a first preferred embodiment of the present invention.

FIG. 1 shows a multilayer ceramic capacitor 10 as an example of an electronic component according to a first preferred embodiment. The first preferred embodiment is one configuration of a structure in which the multilayer ceramic capacitor 10 is mounted on a board.

The multilayer ceramic capacitor 10 has a rectangular or substantially rectangular parallelepiped shape. The multilayer ceramic capacitor 10 includes a component main body 11 and a pair of external electrodes 16. As shown in FIG. 1, the multilayer ceramic capacitor 10 and the component main body 11 have in common a length direction L, a width direction W orthogonal or substantially orthogonal to the length direction L, and a thickness direction T orthogonal or substantially orthogonal to the length direction L and the width direction W.

As the dimensions of the multilayer ceramic capacitor 10, the dimension in the length direction L is, for example, about 0.2 mm or more and about 1.7 mm or less, the dimension in the width direction W is, for example, about 0.12 mm or more and about 0.9 mm or less, and the dimension in the thickness direction T is, for example, about 0.12 mm or more and about 0.9 mm or less. However, the dimensions are not limited thereto.

The component main body 11 includes a pair of main surfaces 17a opposed to each other in the thickness direction T, a pair of lateral surfaces 17b opposed to each other in the width direction W, and a pair of end surfaces 17c opposed to each other in the length direction L.

The component main body 11 includes an inner layer portion 12 therein. The inner layer portion 12 includes a multilayered structure in which a plurality of internal electrode layers and a plurality of inner dielectric ceramic layers (not shown) are alternately laminated in the thickness direction T. Four surfaces of the inner layer portion 12 on both sides in the width direction W and on both sides in the thickness direction T are covered with an outer dielectric ceramic layer 13 made of the same material as the dielectric ceramic layer.

The internal electrode layer of the inner layer portion 12 is, for example, made of a metal material such as Ni, Cu, Ag, Pd, Ag—Pd alloy, Au, or the like. However, the material for the internal electrode layer is not limited to these metal materials, and another material may be used.

The inner dielectric ceramic layer and the outer layer dielectric ceramic layer 13 defining the inner layer portion 12 are formed by firing, for example, a ceramic material including barium titanate as a main component or another ceramic material having a high dielectric constant (for example, including $CaTiO_3$, $SrTiO_3$, $CaZrO_3$, or the like as a main component).

The pair of external electrodes 16 is provided at both ends in the length direction L of the component main body 11. Each of the external electrodes 16 covers a corresponding one of the pair of end surfaces 17c of the component main body 11. In the plurality of internal electrode layers in the inner layer portion 12, one of the internal electrode layers adjacent to each other in the thickness direction T is connected to one external electrode 16, and the other one is connected to the other external electrode. Each of the pair of external electrodes 16 has an end surface 16a in the length direction L.

The external electrode 16 includes, for example, a laminated film including a sintered metal layer and a plating layer. The sintered metal layer is formed by, for example, firing a paste such as Cu, Ni, Ag, Pd, Ag—Pd alloy, or Au. The plating layer includes, for example, a Ni-plated layer and a Sn-plated layer covering the Ni-plated layer.

The multilayer ceramic capacitor 10 is manufactured, for example, by forming a pair of external electrodes 16 by firing, plating, or the like after the component main body 11 is fired. A portion of the external electrode 16 may be fired simultaneously with the component main body 11, and then, for example, a plating layer of the external electrode 16 may be formed later.

Figure 2:
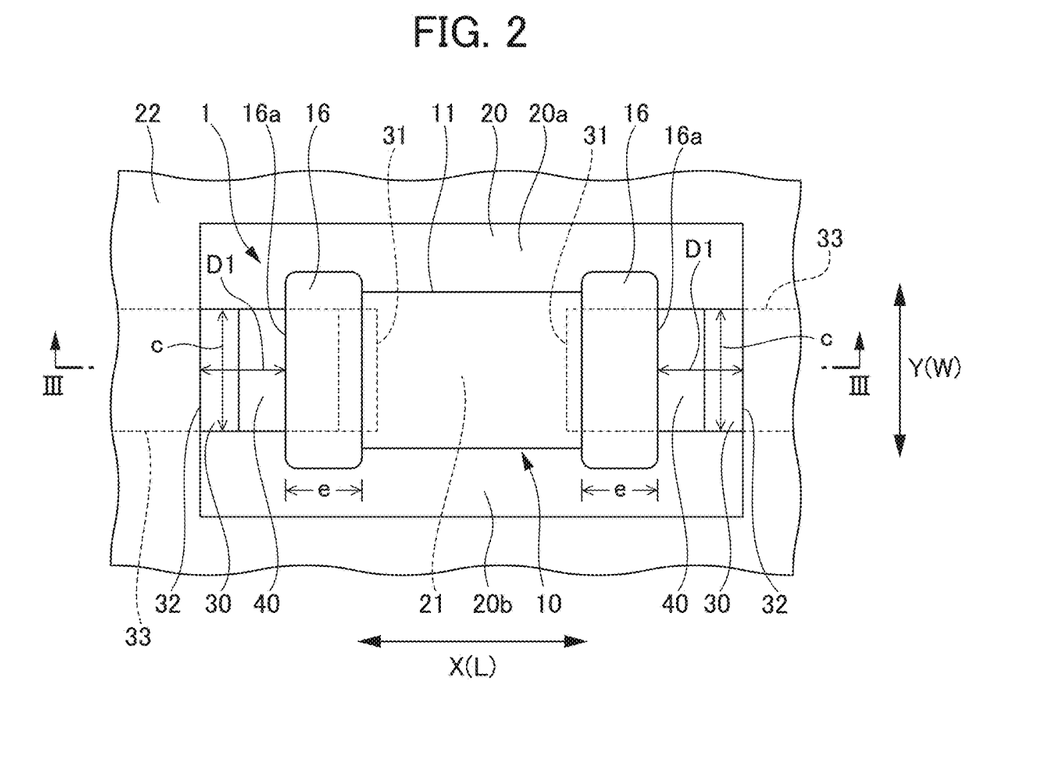
FIG. 2 is a plan view showing the mounting structure according to the first preferred embodiment of the present invention.
Figure 3:
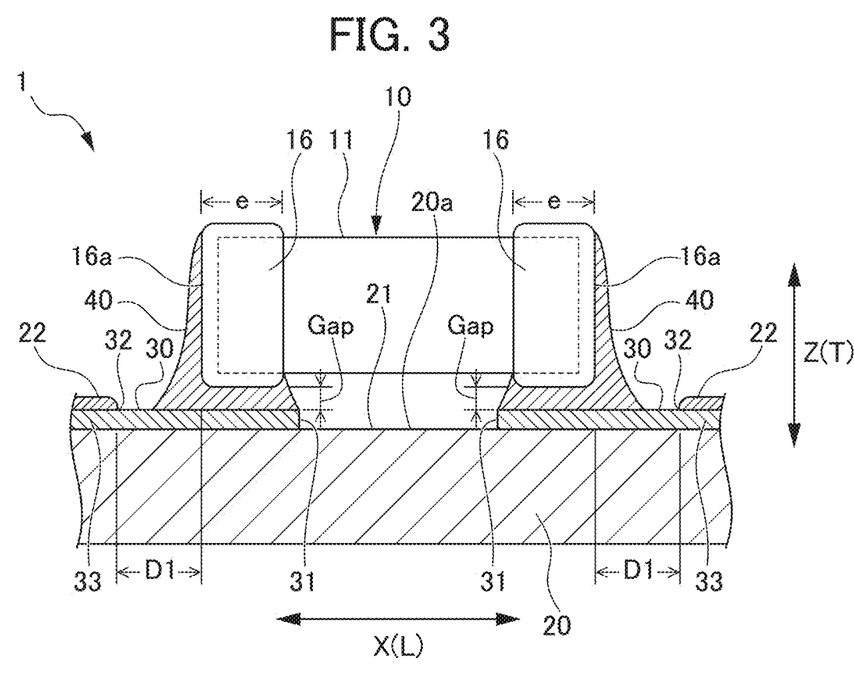
FIG. 3 is a cross-sectional view taken along the line of FIG. 2.

FIGS. 2 and 3 show the mounting structure 1 according to the first preferred embodiment in which the multilayer ceramic capacitor 10 is mounted on a board 20. FIG. 2 is a plan view of the mounting structure 1, and FIG. 3 is a cross-sectional view taken along the line III-III of FIG. 2. The mounting structure 1 includes the board 20, a pair of lands 30 provided on the board 20 so as to be spaced apart from each other, solder 40 provided on the lands 30, and the multilayer ceramic capacitor 10. The multilayer ceramic capacitor 10 is mounted on the board 20 by soldering.

The board 20 is formed in a sheet shape from a material made of, for example, an insulating material such as resin, glass, glass epoxy, paper phenol, or ceramics. The front surface 20a of the board 20 is covered with an insulating film 22 made of solder resist, while leaving a rectangular or substantially rectangular mounting region 20b.

Wirings 33 are provided on the front surface 20a of the board 20. The wirings 33 are each discontinuous with a separation portion 21 interposed therebetween in the mounting region 20b, and the pair of lands 30, which are portions where the wiring 33 is not covered with the insulating film 22, are exposed on both sides of the separation portion 21. The pair of lands 30 are each a portion of the wiring 33 exposed in the mounting region 20b. The pair of lands 30 are provided on the front surface 20a of the board 20 so as to be spaced apart from each other in the X direction.

The wiring 33 including the land 30 is formed by, for example, depositing a highly conductive metal such as Cu or Ag on the surface 20a of the board 20. Each of the pair of lands 30 has a rectangular or substantially rectangular shape in plan view as shown in FIG. 2, and has the same or substantially the same shape and size. The pair of lands 30 are provided in parallel or substantially in parallel in the X direction so that the positions in the Y direction orthogonal or substantially orthogonal to the X direction are the same or substantially the same. Each of the pair of lands 30 includes an inner edge 31 on the separation portion 21 side and an outer edge 32 on the side opposite to the separation portion 21 in the X direction.

The outer edge 32 is a boundary portion between the insulating film 22 and the land 30. Both of the inner edge 31 and the outer edge 32 extend in the Y direction.

In the multilayer ceramic capacitor 10 mounted on the board 20, the length direction L follows or substantially follows the X direction, the width direction W follows or substantially follows the Y direction, and the thickness direction T follows or substantially follows the vertical direction Z orthogonal or substantially orthogonal to the surface 20a of the board 20. With such a configuration, one main surface 17a of the component main body 11 is opposed to the surface 20a of the board 20 in parallel or substantially in parallel. In the multilayer ceramic capacitor 10, one external electrode 16 is connected to one land 30 via solder 40, and the other external electrode 16 is connected to the other land 30 via solder 40. The end surfaces 16a of the external electrodes 16 are each substantially covered with the solder 40. The multilayer ceramic capacitor 10 is provided such that the center in the width direction W coincides or substantially coincides with the center in the width direction W of each land 30.

As shown in FIG. 2, the end surface 16a of each external electrode 16 is positioned closer to the inner edge 31 than the outer edge 32 of the land 30. Therefore, each land 30 includes the inner edge 31 which overlaps the multilayer ceramic capacitor 10 in the length direction L and the outer edge 32 which does not overlap the multilayer ceramic capacitor 10 in the length direction L.

Figure 4:
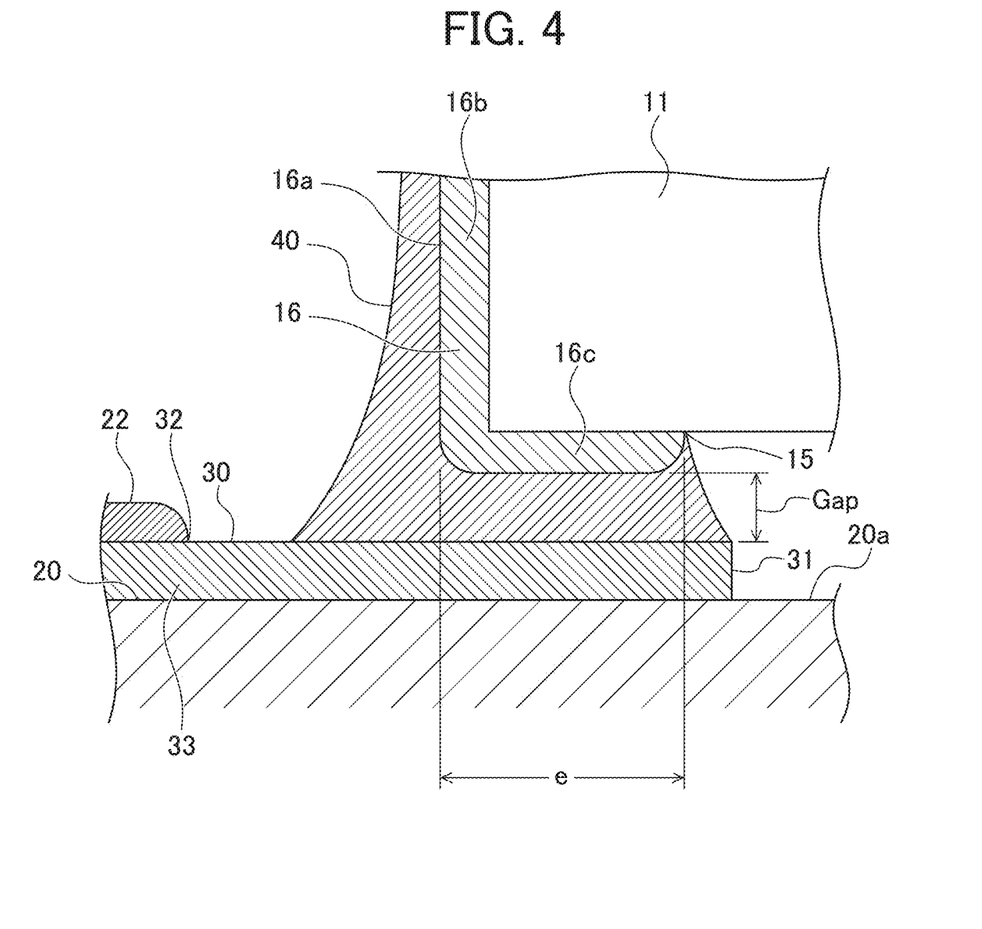
FIG. 4 is a partially enlarged cross-sectional view showing a main portion of the mounting structure according to the first preferred embodiment of the present invention.

As shown in FIG. 4, each of the pair of external electrodes 16 includes a flat-plate-shaped end surface covering portion 16b that covers the end surface 17c of the component main body 11, and a rectangular or substantially rectangular cylindrical bent portion 16c that is bent from the end surface covering portion 16b inwardly toward the component main body 11 in the length direction L and covers the pair of main surfaces 17a and the pair of lateral surfaces 17b. The bent portion 16c that covers one main surface 17a of the component main body 11 opposed to the board 20 is connected to the land 30 via the solder 40.

The solder 40 is not particularly limited as long as it has characteristics suitable for the respective external electrodes 16 and the respective lands 30, and may be, for example, Sn—Pb solder 40, Sn—Ag—Cu solder 40, Sn—Cu solder 40, Sn—Bi solder 40, or the like.

As shown in FIG. 4, a gap Gap is provided between the land 30 and the bent portion 16c of the external electrode 16 opposed to the land 30. This gap Gap refers to an amount corresponding to the thickness of the solder 40 interposed between the land 30 and the bent portion 16c of the external electrode 16. The solder 40 fills the gap Gap between the external electrode 16 and the land 30 without any interval.

As shown in FIGS. 2 to 4, in the mounting structure 1 of the first preferred embodiment, when the width dimension of the land 30 along the Y direction is defined as c, the dimension of the external electrode 16 in the X direction is defined as e, and the gap between the land 30 and the bent portion 16c of the external electrode 16 is defined as Gap, the following expression (1) is satisfied, and preferably, the following expression (2) is satisfied.

$$3.4<(c \times e)/Gap<258.8 \quad (1)$$

$$9.0<(c \times e)/Gap<48.2 \quad (2)$$

Furthermore, c/e is preferably 0.5 or more and 4 or less, for example.

In the first preferred embodiment, soldering by the solder 40 can be performed by reflow, for example. That is, the multilayer ceramic capacitor 10 can be reflow-mounted on the board 20. In a case of the reflow mounting, since a paste solder material is applied to the land 30 in advance, the area of the solder 40 may be relatively small. For example, the distance D1 in the in-plane direction of the board 20 between the end surface 16a of the external electrode 16 and the outer edge 32 of the land 30 is about 0.8 mm when the dimension in the width direction W is about 0.8 mm. In addition, D1 is preferably, for example, about 0.02 mm or more and about 0.8 mm or less. That is, D1 preferably has a dimension in the width direction of W/2 to W. When the external electrodes 16 are not provided on the pair of lateral surfaces 17b, D1 can be further reduced, and when the dimension in the width direction W is from about 0.3 mm to about 0.8 mm, for example, it can be set to about 0.02 mm or more and about 0.05 mm or less, for example. That is, the width dimension is preferably about 1.1 W, for example.

In the mounting structure 1 according to the first preferred embodiment, when stress is applied to the multilayer ceramic capacitor 10 due to deflection of the board 20 or the like, cracks are likely to occur in the component main body 11 starting from the boundary portion 15 between the end edge of the bent portion 16c of the external electrode 16 and the component main body 11 shown in FIG. 4. However, in the mounting structure 1 according to the first preferred embodiment, by satisfying the above expression (1), stress is less likely to be applied to the boundary portion 15, and the generation of cracks can be reduced or prevented. By satisfying the expression (2), stress is less likely to be applied to the boundary portion 15, and crack reduction or prevention effect can be more significantly obtained.

The mounting structure 1 of the electronic component according to the first preferred embodiment as described above includes the multilayer ceramic capacitor 10 as an example of an electronic component including the pair of lands 30 provided on the board 20 and spaced apart from each other, solder 40 provided on each of the lands 30, and the component main body 11 having the length direction L and the pair of external electrodes 16 provided on both end portions of the component main body 11 in the length direction L, each of the pair of external electrodes 16 being connected to a corresponding one of the pair of lands 30 via the solder 40, in which, in a case in which a separation direction of the pair of lands 30 is defined as the X direction and a direction orthogonal or substantially orthogonal to the X direction is defined as the Y direction, when the width dimension of the land 30 along the Y direction is defined as c, the dimension of each of the external electrodes 16 in the X direction is defined as e, and a gap between the land 30 and the external electrode 16 is defined as Gap, the following expression (1) is satisfied:

$$3.4<(c \times e)/Gap<258.8 \quad (1).$$

With such a configuration, it is possible to reduce or prevent the generation of cracks in the multilayer ceramic capacitor 10 when deflection occurs in the board 20.

In the mounting structure 1 according to the first preferred embodiment, it is preferable that the following expression (2) is satisfied:

$$9.0<(c \times e)/Gap<48.2 \quad (2).$$

With such a configuration, it is possible to significantly obtain a crack reduction or prevention effect.

In the mounting structure 1 according to the first preferred embodiment, the lands 30 each may include the inner edge 31 overlapping with the electronic component 10 in the length direction L and the outer edge 32 not overlapping with the electronic component 10 in the length direction L, and the distance D1 in the in-plane direction of the board 20 between the end surface 16a of the external electrode 16 in the length direction L and the outer edge 32 of the land 30 may be about 0.02 mm or more and about 0.8 mm or less, for example.

With such a configuration, it is possible to maintain the size of the land 30 to the minimum necessary size while accurately performing soldering by the reflow mounting.

Second Preferred Embodiment

Next, a second preferred embodiment of the present invention will be described with reference to FIGS. 5 and 6. The second preferred embodiment is obtained by partially modifying the first preferred embodiment. Therefore, in the drawings, the same or corresponding components as those in the first preferred embodiment are denoted by the same reference numerals, a description thereof will be omitted, and only the differences will be mainly described.

Figure 5:
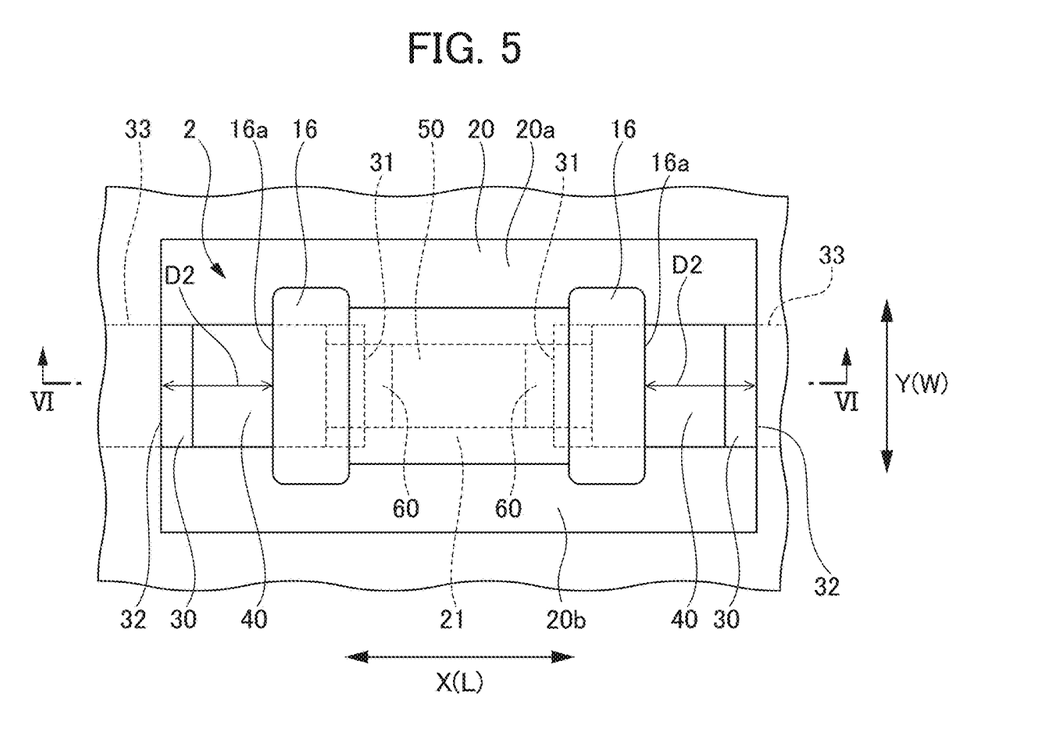
FIG. 5 is a plan view showing a mounting structure according to a second preferred embodiment of the present invention.
Figure 6:
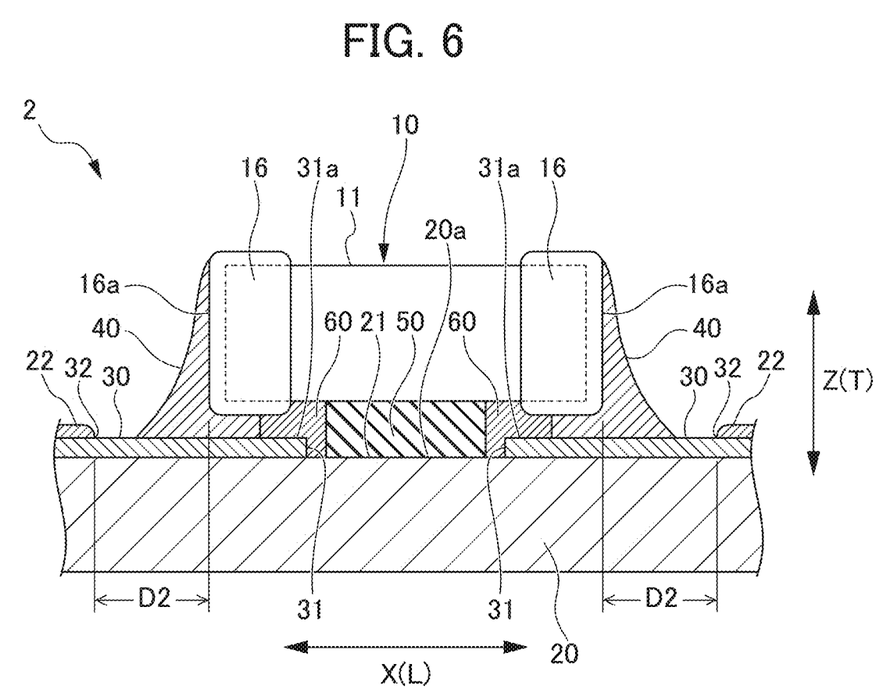
FIG. 6 is a cross-sectional view taken along the line VI-VI of FIG. 5.

FIG. 5 is a plan view of a mounting structure 2 according to the second preferred embodiment, and FIG. 6 is a cross-sectional view taken along the line VI-VI of FIG. 5. In the mounting structure 2, an adhesive 50 for bonding the component main body 11 of the multilayer ceramic capacitor 10 and the board 20 is provided between the pair of lands 30. The adhesive 50 is provided substantially at the center of the separation portion 21.

Furthermore, solder adhesion preventing materials 60 are provided on both sides of the adhesive 50 in the X direction. As shown in FIG. 6, when viewed from the lateral side, the solder adhesion preventing material 60 fills the space surrounded by the multilayer ceramic capacitor 10, the land 30, the board 20, and the adhesive 50. With such a configuration, an end portion 31a including the inner edge 31 of each land 30 is covered with the solder adhesion preventing material 60 that prevents adhesion of the solder 40 to the end portion 31a. Furthermore, the above boundary portion 15 is covered with a solder adhesion preventing material 60.

As the adhesive 50, for example, an epoxy resin adhesive or the like is used. As the solder adhesion preventing material 60, for example, a resist or an adhesive can be used. For the resist or the adhesive defining and functioning as the solder adhesion preventing material 60, for example, an epoxy resin adhesive may be used. Therefore, the adhesive 50 and the solder adhesion preventing material 60 may be provided integrally with the epoxy resin adhesive.

In the second preferred embodiment, soldering by the solder 40 can be performed by, for example, flow by spraying of the solder 40. That is, the multilayer ceramic capacitor 10 can be flow-mounted on the board 20. In a case of the flow mounting, it is preferable to set the region where the solder 40 is sprayed wider than in a case of reflow. Therefore, as shown in FIG. 5, it is preferable that the distance D2 in the in-plane direction of the board 20 between the end surface 16a of the external electrode 16 and the outer edge 32 of the land 30 is longer than that in the first preferred embodiment, and is, for example, about 0.3 mm or more and about 0.6 mm or less when the dimension in the width direction W is about 0.3 mm, and about 0.8 mm or more and about 1.6 mm or less when the dimension in the width direction W is about 0.8 mm, and is equal or substantially equal to the dimension in the width direction W to twice the dimension in the width direction W.

In the mounting structure 2 of the second preferred embodiment, the solder adhesion preventing material 60 is provided before mounting the multilayer ceramic capacitor 10, and when mounting the multilayer ceramic capacitor 10, the multilayer ceramic capacitor 10 is bonded to the board 20 with the adhesive 50. Therefore, the gap Gap is an amount corresponding to the thickness of the solder adhesion preventing material 60 existing between the external electrode 16 and the land 30. The adhesive 50 prevents the multilayer ceramic capacitor 10 from falling from the board 20 to perform flow mounting.

In the mounting structure 2 according to the second preferred embodiment, the adhesive 50 for bonding the multilayer ceramic capacitor 10 and the board 20 is provided between the pair of lands 30.

According to the second preferred embodiment, it is possible to mount the multilayer ceramic capacitor 10 on the board 20 by the solder 40 after the multilayer ceramic capacitor 10 is bonded to the board 20 by the adhesive 50 so as not to fall from the board 20. With such a configuration, the degree of freedom of the installation posture of the board 20 at the time of mounting increases, such that mounting can be easily performed.

In the mounting structure 2 according to the second preferred embodiment, the land 30 includes the inner edge 31 overlapping in the length direction L and the outer edge 32 not overlapping in the length direction L with respect to the multilayer ceramic capacitor 10, the distance D1 in the in-plane direction of the board 20 between the end surface 16a of the external electrode 16 in the length direction L and the outer edge 32 of the land 30 is, for example, about 0.3 mm or more and about 1.6 mm or less, and the adhesive 50 for bonding the multilayer ceramic capacitor 10 and the board 20 is provided between the pair of lands 30.

With such a configuration, it is possible to maintain the size of the land 30 to the minimum necessary size while accurately performing soldering by flow mounting.

In the mounting structure 2 according to the second preferred embodiment, the end portion 31a including the inner edge 31 of the land 30 is preferably covered with the solder adhesion preventing material 60 for preventing adhesion of the solder 40 to the end portion 31a. As the solder adhesion preventing material 60, for example, a resist or an adhesive can be used.

With such a configuration, the gap Gap between the land 30 and the external electrode 16 can be ensured by the solder adhesion preventing material 60, and the amount of the gap Gap can be easily adjusted by the thickness of the solder adhesion preventing material 60, and as a result, the bonding strength by the thickness of the solder 40 can be appropriately adjusted. Furthermore, if the boundary portion 15 between the external electrode 16 and the component main body 11 is covered with the solder adhesion preventing material 60 so that the solder 40 does not reach the boundary portion 15, it is possible to further reduce or prevent the occurrence of cracks in the multilayer ceramic capacitor 10.

The present invention is not limited to the above-described preferred embodiments, and modifications, improvements, and the like are included in the present invention as long as the advantageous effects of the present invention can be achieved.

For example, in the mounting structure 1 of the first preferred embodiment, the multilayer ceramic capacitor 10 and the board 20 may be bonded to each other by providing the adhesive 50 between the multilayer ceramic capacitor 10 and the board 20 as in the second preferred embodiment. It is also possible to obtain the mounting structure 2 of the second preferred embodiment by employing, for example, reflow mounting. In this case, a structure may be established in which the adhesive 50 is not used and only the solder adhesion preventing material 60 is provided before mounting. When the adhesive 50 is not used, the portion to be occupied by the adhesive 50 shown in FIG. 6 may be made hollow, and the portion to be occupied by the adhesive 50 may also be filled with the solder adhesion preventing material 60.

The multilayer ceramic capacitors 10 in the above preferred embodiments are each an example of an electronic component, the electronic component is not limited thereto, and other two-terminal electronic components such as, for example, inductors can also be applied. For example, in a case of an inductor, the component main body is made of magnetic ceramics or the like.

EXAMPLES

Hereinafter, an Example of a preferred embodiment of the present invention will be described. In a mounting structure having the same or substantially the same configuration as that of the mounting structure 1 shown in the first preferred embodiment, it was assumed that the stress at which cracks occurred in the component main body 11 of the multilayer ceramic capacitor 10 due to bending of the board 20 was about 135 MPa. The value of (c×e)/Gap at the time when the stress for bending the board 20 reached about 135 MPa was virtually obtained. The results are shown in Table 1.

Figure 7:
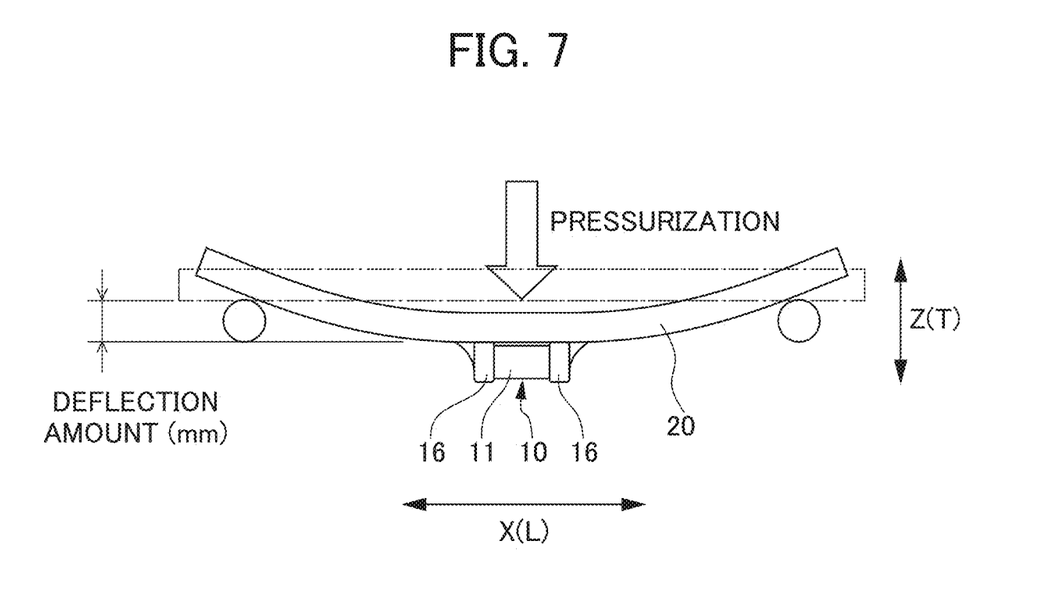
FIG. 7 is a side view schematically showing a test method of an Example of a preferred embodiment of the present invention.

As shown in FIG. 7, the deflection amount (mm) was defined as the amount of downward displacement at the center portion of the board 20 when the board 20 was bent by pressurizing the center portion between both ends from above in a state in which the board 20 on which the multilayer ceramic capacitor 10 was mounted was supported at both ends in the length direction L, while the multilayer ceramic capacitor 10 was provided on the lower side. In the Example, (c×e)/Gap was obtained when the deflection amounts were about 1 mm, about 2 mm, about 3 mm, and about 4 mm, respectively.

TABLE 1

| DEFLDEFLECTION AMOUNT | STRESS (MPa) | (c × e)/Gap |
|---|---|---|
| 1 mm | 135 | 61.06 |
| 2 mm | 135 | 5.83 |
| 3 mm | 135 | 3.06 |
| 4 mm | 135 | 2.24 |

Figure 8:
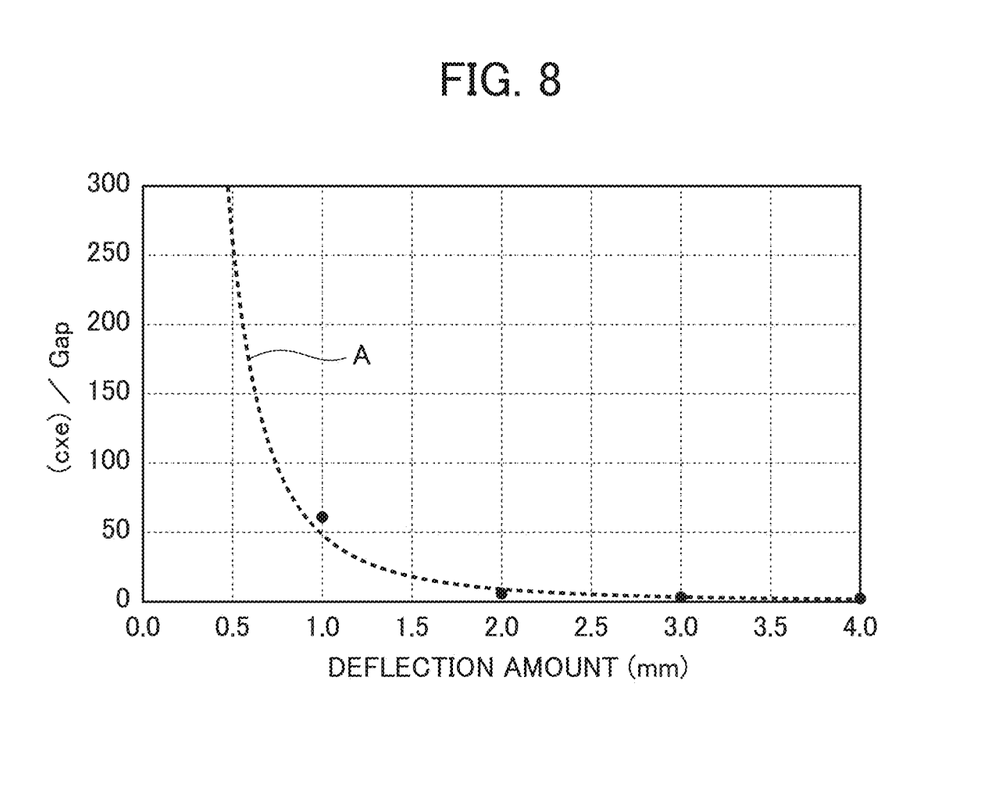
FIG. 8 is a graph showing the relationship between the deflection amount and (c×e)/Gap based on the results of the Example.

As shown in FIG. 8, the values of (c×e)/G in a case where the deflection amounts of the board 20 were about 1 mm, about 2 mm, about 3 mm, and about 4 mm, respectively, were plotted in Table 1. The curve A in FIG. 8 shows the relationship between the deflection amounts obtained from the plot and (c×e)/Gap.

In order to obtain a mounting structure in which cracks do not occur in the multilayer ceramic capacitor, even when the deflection amount of the board is about 1 mm or more and about 2 mm or less, "9.0<(c×e)/Gap<48.2" is required in view of FIG. 8. Furthermore, when more deflection amount is allowed and the deflection amount of the board may be about 0.5 mm or more and about 3 mm or less, "3.4<(c×e)/Gap<258.8" may be set in view of FIG. 8.

From these results, it is understood that (c×e)/Gap is preferably 3.4<(c×e)/Gap<258.8, and more preferably 9.0<(c×e)/Gap<48.2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mounting structure of an electronic component comprising:
   the electronic component including:
      a pair of lands on a board and spaced apart from each other;
      solder on each of the lands; and
      a component main body including a pair of external electrodes on both end portions of the component main body in a length direction, each of the pair of external electrodes being connected to a corresponding one of the pair of lands via the solder; wherein
   where a separation direction of the pair of lands is defined as an X direction and a direction orthogonal or substantially orthogonal to the X direction is defined as a Y direction, when a width dimension of the land along the Y direction is defined as c, a dimension of each of the external electrodes in the X direction is defined as e, and a gap between the land and the external electrode is defined as Gap, 3.4<(c×e)/Gap<258.8 is satisfied.

2. The mounting structure of an electronic component according to claim 1, wherein 9.0<(c×e)/Gap<48.2 is satisfied.

3. The mounting structure of an electronic component according to claim 1, wherein
   each of the pair of lands includes an inner edge overlapping with the electronic component in the length direction and an outer edge not overlapping with the electronic component in the length direction; and
   a distance in an in-plane direction of the board between an end surface of the external electrode in the length direction and the outer edge of the land is about 0.02 mm or more and about 0.8 mm or less.

4. The mounting structure of an electronic component according to claim 1, wherein an adhesive to bond the electronic component and the board is provided between the pair of lands.

5. The mounting structure of an electronic component according to claim 1, wherein
   each of the pair of lands includes an inner edge overlapping with the electronic component in the length direction and an outer edge not overlapping with the electronic component in the length direction;
   a distance in an in-plane direction of the board between an end surface of the external electrode in the length direction and the outer edge of the land is about 0.3 mm or more and about 1.6 mm or less; and
   an adhesive to bond the electronic component and the board is provided between the pair of lands.

6. The mounting structure of an electronic component according to claim 3, wherein an end portion including the inner edge of the land is covered with a solder adhesion preventing material to prevent adhesion of the solder to the end portion.

7. The mounting structure of an electronic component according to claim 6, wherein the solder adhesion preventing material is a resist.

8. The mounting structure of an electronic component according to claim 6, wherein the solder adhesion preventing material is an adhesive.

9. The mounting structure of an electronic component according to claim 1, wherein a dimension of the electronic component in the length direction L is about 0.2 mm or more and about 1.7 mm or less, a dimension of the electronic component in a width direction W is about 0.12 mm or more and about 0.9 mm or less, and a dimension of the electronic component in a thickness direction T is about 0.12 mm or more and about 0.9 mm or less.

10. The mounting structure of an electronic component according to claim 1, wherein the electronic component includes a plurality of internal electrode layers and a plurality of dielectric ceramic layers that are alternately laminated.

11. The mounting structure of an electronic component according to claim 10, wherein each of the plurality of internal electrode layers includes at least one of Ni, Cu, Ag, Pd, Ag—Pd alloy, or Au.

12. The mounting structure of an electronic component according to claim 10, wherein each of the plurality of dielectric ceramic layers includes $CaTiO_3$, $SrTiO_3$, or $CaZrO_3$ as a main component.

13. The mounting structure of an electronic component according to claim 1, wherein each of the pair of external electrodes includes a sintered metal layer and a plating layer on the sintered metal layer.

14. The mounting structure of an electronic component according to claim 13, wherein the sintered metal layer includes at least one of Cu, Ni, Ag, Pd, Ag—Pd alloy, or Au.

15. The mounting structure of an electronic component according to claim 13, wherein the plating layer includes a Ni-plated layer and a Sn-plated layer.

* * * * *